(12) United States Patent
Jo et al.

(10) Patent No.: US 7,112,271 B2

(45) Date of Patent: Sep. 26, 2006

(54) METHOD AND APPARATUS FOR MAKING VERY LOW ROUGHNESS COPPER FOIL

(75) Inventors: Cha Jae Jo, Gyeonggi-do (KR); Chang Hee Choi, Gyeonggi-do (KR); Sangyum Kim, Gyeonggi-do (KR); Jeong Ik Kim, Seoul (KR)

(73) Assignee: LG Cable Ltd., Seoul (KR)

(*) Notice: Subject to any disclaimer, the term of this patent is extended or adjusted under 35 U.S.C. 154(b) by 243 days.

(21) Appl. No.: 10/722,469

(22) Filed: Nov. 28, 2003

(65) Prior Publication Data

US 2004/0108216 A1    Jun. 10, 2004

(30) Foreign Application Priority Data

Nov. 29, 2002    (KR) .................... 10-2002-0075412

(51) Int. Cl.
     *C25F 3/16*    (2006.01)
(52) U.S. Cl. ........................ 205/660; 205/640
(58) Field of Classification Search .............. 205/660
     See application file for complete search history.

(56) References Cited

U.S. PATENT DOCUMENTS

| 5,449,441 A | 9/1995 | Amor et al. |
| 5,792,333 A | 8/1998 | Oguro et al. |
| 5,834,140 A | 11/1998 | Wolski et al. |
| 2003/0178320 A1* | 9/2003 | Liu et al. ............ 205/640 |
| 2003/0221974 A1* | 12/2003 | Shieh et al. ............ 205/677 |
| 2004/0043242 A1* | 3/2004 | Nakaoka et al. ............ 428/553 |

FOREIGN PATENT DOCUMENTS

| JP | 51025766 A | * | 3/1976 |
| JP | 62188785 A | * | 8/1987 |
| JP | 8-120499 A | * | 5/1996 |
| SU | 479820 A | * | 12/1975 |

* cited by examiner

*Primary Examiner*—Roy King
*Assistant Examiner*—Michael P. Alexander
(74) *Attorney, Agent, or Firm*—Rothwell, Figg, Ernst & Manbeck, P.C.

(57) ABSTRACT

A method for manufacturing a very low roughness copper foil and an apparatus for manufacturing the copper foil. In the method of the present invention, a pickling process, an electrolytic polishing process and a washing process are successively performed after the copper foil was manufactured. In order to manufacture the very low roughness copper foil, the electrolytic polishing process is accomplished with the copper foil to face a metal cathode plate and supplying a current in order to perform the electrolytic polishing.

16 Claims, 7 Drawing Sheets

METHOD AND APPARATUS FOR MAKING VERY LOW ROUGHNESS COPPER FOIL

BACKGROUND OF THE INVENTION

1. Field of the Invention

The present invention relates to a method for manufacturing a low roughness copper foil for a printed circuit board (PCB) of a fine pattern, and more particularly to a method for manufacturing a copper foil having very low roughness and gloss surface by treating the copper foil manufactured by an electrodeposition or a mechanical rolling and an apparatus for manufacturing the copper foil.

2. Description of the Background Art

Recently, as an electronic device is manufactured relatively smaller and lighter, an integrated chip (IC) adopted to the device is designed to have its wiring width fine. To implement the desired wiring width, IC wiring requests a copper foil rendering its width to be finely formed as the scale of several tens of microns. For example, if a circuit pattern is designed with a wiring width of about 100 μm, a thickness of the copper foil should be about 15 to 35 μm. Also, if a circuit pattern is designed with a wiring width of several tens of micrometers, a thickness of the copper foil should be thinner than the thickness of 15 to 35 μm.

Generally, the copper foil for a microcircuit is manufactured by a method such as an electrodeposition, a mechanical rolling, etc.

The electrodeposition manufactures a copper using a rotating drum and an anode plate apart from the surface of the rotating drum with a predetermined distance in an electrolytic cell. When a negative current is applied to the drum and a positive current is applied to the anode plate, a copper ion is electrochemically precipitated between the drum and the anode plate during the drum is rotated, and then the copper ion is electrodeposited on a surface of the drum. The electrodeposited copper foil is led by the drum, and then is rolled up to the outside from the electrolytic cell.

Here, the electrodeposited copper foil has a shiny side contacting the surface of the drum and a matte side as the opposite side of the shiny side. The roughness of the shiny side is formed to be similar to that of the drum. The roughness of the matt side depends on the electrodeposition status of the copper foil and the thickness thereof. Here, the roughness of the matt side is larger than that of the shiny side.

Generally, a roughness of the matt side is about 2.0 to 10 μm. If the roughness of the matt side is excessively high, when a wiring pattern is formed at a PCB, copper may remain on the wiring pattern after etching. Therefore, to get rid of the remaining copper from the wiring pattern, the electrodeposited copper foil surface is further processed by mechanical or chemical polishing.

For example, the mechanical polishing method is to manufacture a planar surface of a copper foil using a buff, etc., and is used to treat a surface of a relatively thick copper foil. However, the method may not be used to treat a thin copper foil because the thin copper foil can be damaged by a mechanical stress thereof.

Meanwhile, a mechanical polishing method manufactures an electrodeposited copper foil for PCB as a matt side of the copper foil is treated such that its roughness is below 1.5 μm before nodulating treatment of the electrodeposited copper foil. But the mechanically polishing method may generate a residual stress on the copper foil and also may generate a striped polishing scar on the surface. In case of forming a circuit pattern on PCB using a relatively thick copper foil, the polishing scar does not affect largely the circuit wiring pattern. However, in case of forming a circuit pattern on PCB using a thin copper foil, the polishing scar results in a short-circuit.

The chemical polishing method is to polish a copper foil by a chemical reaction. Since the chemical polishing method does not damage the copper foil and leave a scar on the surface the copper foil, neither, the method is proper for a relatively thin copper foil. For example, the chemical polishing method is used for the electrodeposited copper foil such that its the matt side has a roughness of 1 to 2 μm, which can be formed a lead pattern of 60 to 80 μm pitch. Here, the electrodeposited copper foil has a thickness of 18 to 30 μm after the chemical polishing.

However, even though the relatively protruded portions on the matte side are polished higher rate than a portion concaved, the chemical polishing method chemically polishes the entire surface of the matte side regardless of whether it is protruded or not on the surface. For example, if the copper foil with a thickness of 18 μm or less is processed by the chemical polishing method, the thickness can be rather partially thinner. Therefore, in case of forming a wiring pattern or a lead on the PCB with the copper foil generating by the chemical polishing method, the circuits in the PCB must have serious defects such that it does not operate. Accordingly, the prior art mechanical or chemical polishing method can not be used for producing a copper foil for a fine circuit of which wiring width is several tens of micrometers or less.

SUMMARY OF THE INVENTION

In consideration of the above-described problems, the primary object of the present invention is to provide a method for manufacturing a copper foil having a very low roughness and both glossy surfaces, which is used to manufacture a printed wiring board having several tens of micrometers of fine pitch or a secondary battery.

Another object of the present invention is to provide an apparatus for manufacturing a copper foil having a very low roughness and both glossy surfaces, which is used to manufacture a printed wiring board having several tens of micrometers of fine pitch or a secondary battery.

Further the object of the present invention is to provide a method for manufacturing a copper foil having a very low and uniform roughness and both glossy surfaces by an electrolytic polishing based on a principle that a current is concentrated on the protruded portions from the surface of the copper foil or the uneven portions including the protruded portions.

To accomplish the above objects, a method for treating a copper foil having a low roughness comprises the steps of pickling a copper foil 40 manufactured by electrodeposition and mechanical rolling within an acid pickling bath 100 containing an acid solution 100*a* (S1000); polishing the copper foil through electrolysis by applying a positive current to the copper foil 40 and by applying a negative current to the cathode plate 210 with dipping the copper foil 40 to face a cathode plate 210 within at least one electrolytic polishing bath 200 installed with the cathode plate and containing a electrolytic polishing solution 200*a* (S2000); and washing the polished copper foil 40 within a water washing bath 300 containing water (S3000).

In the acid pickling step S1000, the acid solution 100*a* may use one selected from the group consisting of sulfuric acid of pH 5.0 or less, hydrochloric acid of pH 5.0 or less, and a mixed solution of sulfuric acid of pH 5.0 or less and hydrochloric acid of pH 5.0 or less.

In the electrolytic polishing step S2000, preferably, the electrolytic polishing solution 200a is one or at least two combination selected from phosphoric acid, sulfuric acid, hydrochloric acid, and boric acid.

Further, preferably, to precisely adjust an electrolytic rate, the electrolytic polishing solution 200a may include one or at lest two chemical compounds selected from the group consisting of chrome acid, urea, mercaptan, and sulfur compounds.

Preferably, acidity (pH) of the electrolytic polishing solution 200a may be in the range of 2.0 to 3.5, a temperature of the electrolytic polishing solution may be in the range of 20 to 90° C., and a current density applied to the electrolytic polishing solution may be in the range of 10 to 70 A/dm$^2$.

Further, preferably, the electrolytic polishing step S2000 may be processed during 20 to 120 seconds per one electrolytic polishing bath.

Further, preferably, to accomplish a uniform electrolysis, the electrolytic polishing step S2000 may be processed with the electrolytic polishing solution 200a making a laminar flow on the surface of the copper foil 40.

Preferably, in the electrolytic polishing step S2000, to perform the electrolytic polish on the matt side of a relatively high roughness with a relatively high rate, the matt side must face the cathode plate 210 in the electrolytic polishing bath.

Further, in case of using a plurality of electrolytic polishing bath 200, to mainly polish the matt side of a relatively high roughness, the matt side of the copper foil 40 must face the cathode plate 210 in an electrolytic polishing bath 200. In order that the matt and shiny sides are alternately proceeded in the electrolytic polishing solution 200a in the electrolytic polishing step, the cathode plates 210 in one of the electrolytic polishing bath 200 must face the matt side of the copper foil and the cathode plates 210 in the other of the electrolytic polishing bath 200 must face the shiny side of the copper foil, alternately. Thus, the matt side and the shiny side of the copper foil are alternately proceeded in the electrolytic polishing step. Then, both sides of the copper foil 40 may be glossy with a low roughness. Also, the matt side of a low roughness may have lower roughness additionally or may further shinier. Here, the copper foil with both glossy and low roughness sides may be used for electrode material of a secondary battery.

It is preferable controlling the electrolytic polishing rate to perform precisely after conducting an electrolytic polishing removes the large convex and concave having a high roughness, since the copper having a uniform low roughness can be manufactured. Further, it is preferable in that, if the electrolytic polishing rate is gradually decreased using a plurality of electrolytic polishing baths 200 containing the electrolytic polishing solutions 200a which has different acidity (pH), temperature, and concentration of corrosion inhibitor, the copper foil having a high roughness may be treated into the copper foil having a low roughness for a short time.

Here, the lower the temperature of the electrolytic polishing solution is the slower the electrolytic polishing rate is, the electrolytic polishing rate in the electrolytic polishing step S2000 can be precisely adjusted as the temperature of the electrolytic polishing solution 200a within a plurality of baths 200 is set to be lower according to the direction of the arrangement of the baths, which is the same as the proceeding direction of the copper foil.

Further, since the higher the acidity (pH) of the electrolytic polishing solution 200a is the slower the electrolytic polishing rate is, the electrolytic polishing rate can be precisely adjusted as the acidity (pH) of the electrolytic polishing solution 200a within a plurality of baths 200 is set to be higher according to the direction of the arrangement of the baths, which is the same as the proceeding direction of the copper foil.

Further, the higher the concentration of the corrosion inhibitor such as urea, mercaptan, chromic acid or sulfur compounds is the slower the electrolytic polishing rate is, the electrolytic polishing rate can be precisely adjusted as the concentration of the corrosion inhibitor added to the electrolytic polishing solution 200a within a plurality of baths 200 is set to higher according to the direction of the arrangement of the baths, which is the same as the proceeding direction of the copper foil.

After processing the water washing step, the copper foil 40 may further processed by a nodulating process to increase a adhesion with a resin in accordance with its usage in Step of S4000. The nodulating process is to form a nodule on the surface of the copper foil 40. Namely, the nodulating process is to dip the copper foil 40 processed by the water washing into the plating solution 400a within the plating bath 400 adjacent to the water washing bath 300, thereby plating the plating solution on the copper foil.

The plating solution 400a may be made by adding one or at least two elements selected from the group consisting of As, Fe, Mo, and Cr to a mixed solution consisting of Cu, $H_2O$ and $H_2SO_4$.

Upon nodulating, it is preferable that the nodule is formed so that an peel strength to prepreg becomes 0.8 kg/cm or more.

The method for treating a copper foil according to the invention may further comprises the post-process step S4100 after the nodulating step S4000.

The post-process step S4100 is to electrodeposite one element selected from the group consisting of Zn, Cr, Co, Ni, Mo, W, Sn, and Fe, etc. on the copper foil 40, in accordance with its usage, or to electrodeposit at least two elements of the above elements on the copper foil by alloy electrodeposition. Preferably, a thickness of electrodeposited layer formed on the copper foil in the post-process step S4100 is in the range of about 50 to 100 Å.

Further, to accomplish the above objects, an apparatus for treating a copper foil(40) comprises an acid pickling bath 100 polishing a copper foil 40 using an acid solution 100a; one or at least two electrolytic polishing baths 200 installed adjacent to the acid pickling bath 100 for polishing the copper foil 40 using an electrolytic polishing solution 200a; a water washing bath 300 installed adjacent to the electrolytic polishing bath 200 for washing the copper foil 40 using water; a plurality of dipping rollers 500 installed within each of the baths 100, 200 and 300 for serially guiding the copper foil 40 into/from each bath; a plurality of outside rollers 510 installed at the outside of each of the baths 100, 200 and 300 for guiding the copper foil 40 are geared with the dipping rollers 500; and cathode plates 210 installed to face a matt side of the copper foil having a relatively high surface roughness. Here, the cathode plates 210 are apart from the surface of the copper foil with predetermined intervals within the electrolytic polishing bath 200 and also are connected to a cathode electrode of the power supply.

It is preferable using a plurality of the electrolytic polishing bath 200 having a different electrolytic polishing rate since the electrolytic polishing may be practiced stably and uniformly.

Preferably, to concentratively perform the electrolytic polish on the matt side of a relatively high roughness, the matt side must face the cathode plate 210 in the electrolytic polishing bath. Then the matt side of the copper foil 40 is polished in the electrolytic polishing bath 2000. Accordingly, the matt side of a relatively high roughness can be mainly proceeded in the electrolytic polishing bath 200.

Further, in case of using a plurality of electrolytic polishing bath 200, to mainly polish the matt side of a relatively high roughness, the matt side of the copper foil 40 must face the cathode plate 210 in an electrolytic polishing bath 200. Alternatively, in order that the matt and shiny sides are alternately proceeded in the electrolytic polishing solution 200a in the electrolytic polishing step, the cathode plates 210 in one of the electrolytic polishing bath 200 must face the matt side of the copper foil and the cathode plates 210 in the other of the electrolytic polishing bath 200 must face the shiny side of the copper foil. Thus, the matt side and the shiny side of the copper foil are alternately proceeded in the electrolytic polishing step. Then, both sides of the copper foil 40 may be glossy with a low roughness. Also, the matt side of a low roughness may have lower roughness additionally or may further shinier. Here, the copper foil with both glossy and low roughness sides may be used for electrode material of a secondary battery.

Preferably, to decrease the deviation of the electrolytic polishing of the copper foil 40, each of the electrolytic polishing baths 200 further may comprise a solution supplying nozzle device 600 for supplying the electrolytic polishing solution 200a according to the direction of the arrangement of the baths, which is the same as the proceeding direction of the copper foil 40.

Preferably, the cathode plate 210 may be implemented as a shape to uniformly form the current density.

The apparatus for treating a copper foil according to the invention may further comprise a plating bath 400 installed adjacent to the water washing bath 300 for forming a nodule on the polished copper foil using a plating solution 400a.

An insulated board, which the copper foil having a low roughness treated by the invention may be adapted to, may include a reinforced glass resin board, or a reinforced paper resin board, etc. Further, the resin forming the insulated board may include a reinforced glass epoxy, BT (Bismaleimid-Triazine), polyester, polyamid, fluororesin (for example, Teflon), liquid crystal polymer, or polyamid, etc.

Further, the electrodepistion copper foil having a low roughness treated according to the invention may be adapted to a TAB (Tape Automated Bonding) tape of a wireless bonding process in an assembling and mounting technology for a high integrated semiconductor chip, such as LSI, etc., or PWB (Printed Wiring Board), such as a flexible printed wiring board, a multi-layer printed wiring board, or a rigid-flexible PWB, etc.

Further, the electrolytic copper foil having a low roughness treated according to the invention may be adapted to COF (Chip On Flex), which is a film connecting a LCD screen for a mobile phone and a main body, COB (Chip On Board), COG (Chip On Glass), which a chip is attached to a LCD glass board, a TCP (Tape Carrier Package) mainly used to Pentium class notebook PC, CSP (Chip Scale Package) adapted to a mobile phone, a digital camcorder, or DVD, etc., or a PWB.

From the foregoing, since the electrolytic polishing according to the invention is to use using a current which is concentrated to a convex portion or an uneven portion of the copper foil, a residual stress and a polishing scar resulted from the mechanical polishing may be restrained. Further, since a phenomenon that a convex portion and a concave portion generated from the chemical polishing are simultaneously polished through electrolysis may be minimized, a copper foil for a fine circuit having a wiring width of several tens of microns or less may be manufactured.

DETAILED DESCRIPTION OF THE PREFERRED EMBODIMENT

Figure 1:
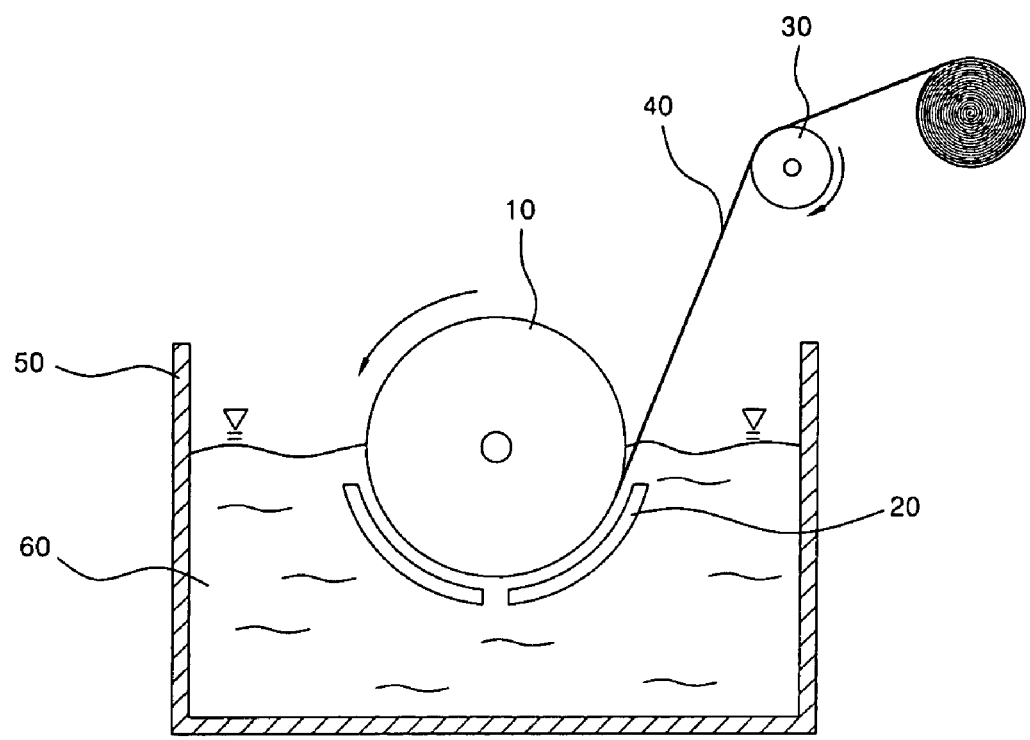
FIG. 1 is a schematic view of a copper foil manufacturing apparatus having a drum in accordance with the present invention.

FIG. 1 is a schematic view of a copper foil manufacturing apparatus having a drum in accordance with the present invention.

An electrolytic cell 50 contains an electrolytic solution 60 as a basic composition, such as sulfuric acid, copper ion, chlorine ion, etc. A cylindrical drum 10 and anode plates 20 with the same curvature of the drum 10, positioned at predetermined intervals from the surface of the drum 10, are dipped in the electrolytic solution 60. The drum 10 is connected to a cathode electrode of a power supply (not shown) and the anode plates 20 are connected to a anode electrode of the power supply.

Thus, when the negative and positive currents are applying to the drum and the anode plates, the copper ion is electrodeposited on the surface of the drum 10 in the electrolytic solution 60. Then the electrodeposited copper is formed as a shape of thin foil 40 on the surface on the drum, and the copper foil 40 is led by a roller 30 installed at the outside of the electrolytic solution 60 to be rolled up as a shape of roll.

The copper foil 40 has a shiny side having a relatively low roughness, which is facing on the drum 10, and a matt side having a relatively high roughness, which is facing the opposite to the shiny side. The roughness of the shiny side of the copper foil depends on that of the surface of the drum 10. The roughness of the matt side of the copper foil has about 2.0 to 10 μm depending on an addition agent, a current density, a flow rate of the electrolytic solution 60, a foil manufacturing rate, etc.

Figure 2:
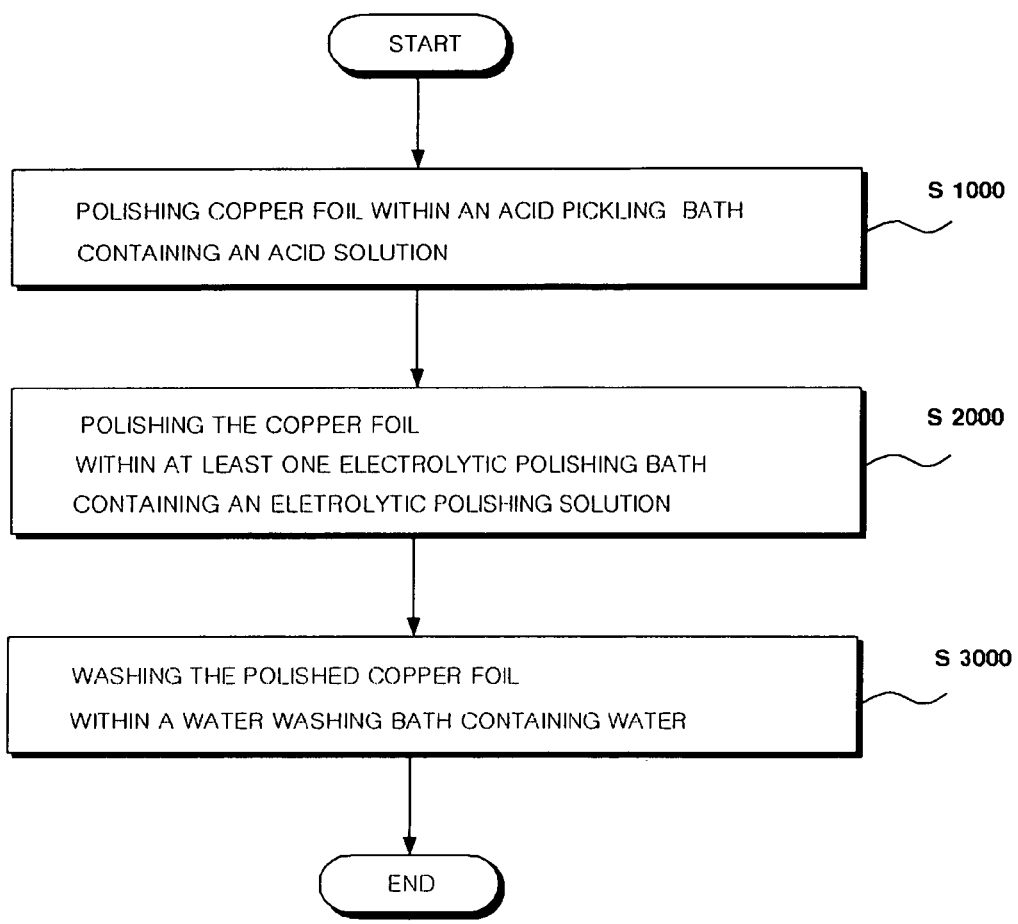
FIG. 2 is a flow chart of a method for manufacturing a copper foil having a low roughness according to one embodiment of the present invention.
Figure 3:
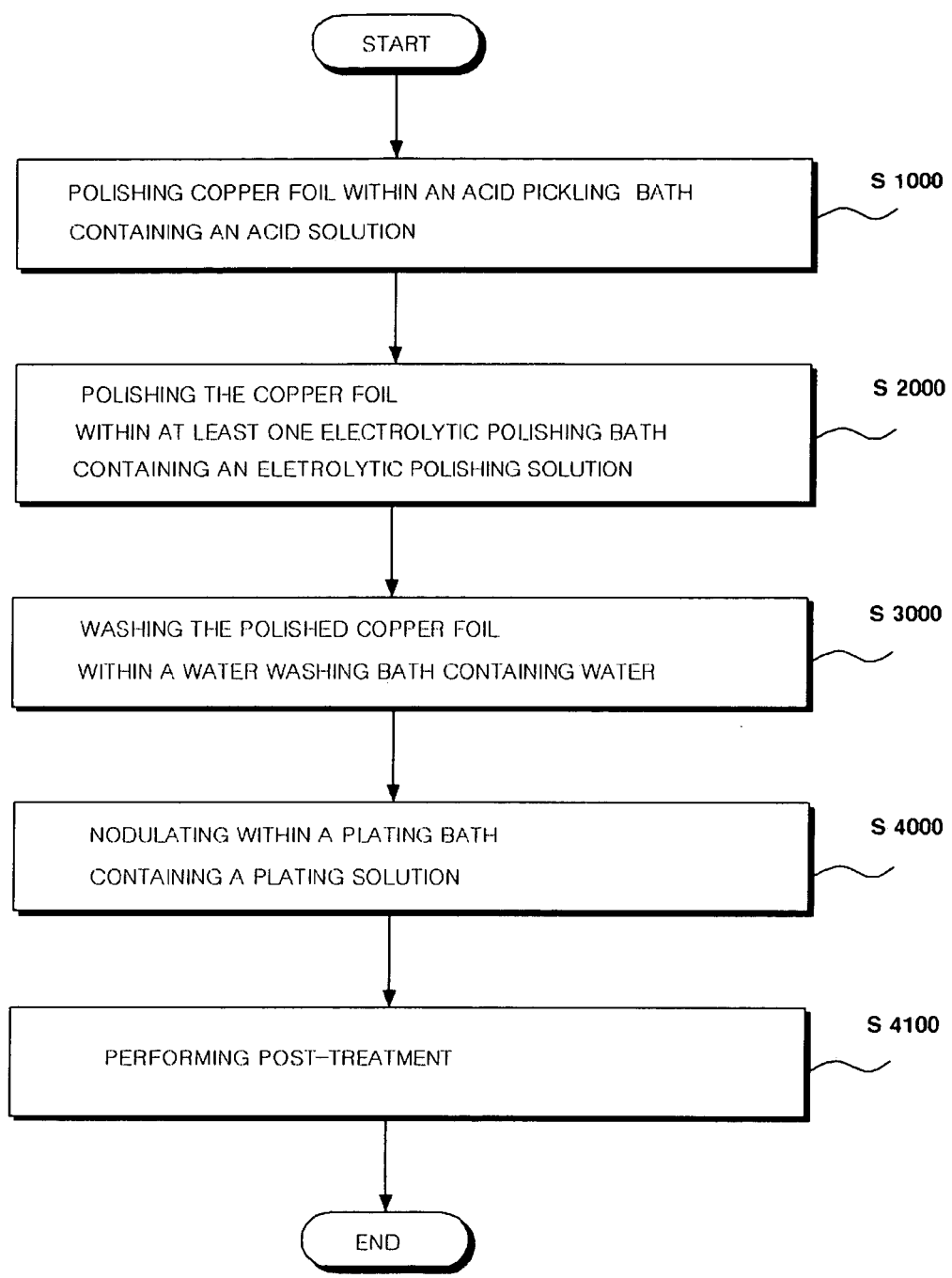
FIG. 3 is a flow chart of a method for manufacturing a copper foil having a low roughness according to the other embodiment of the present invention.

FIGS. 2 and 3 are the flow charts of a method for manufacturing a copper foil having a low roughness according to one and the other embodiments of the present invention, respectively.

Figure 4:
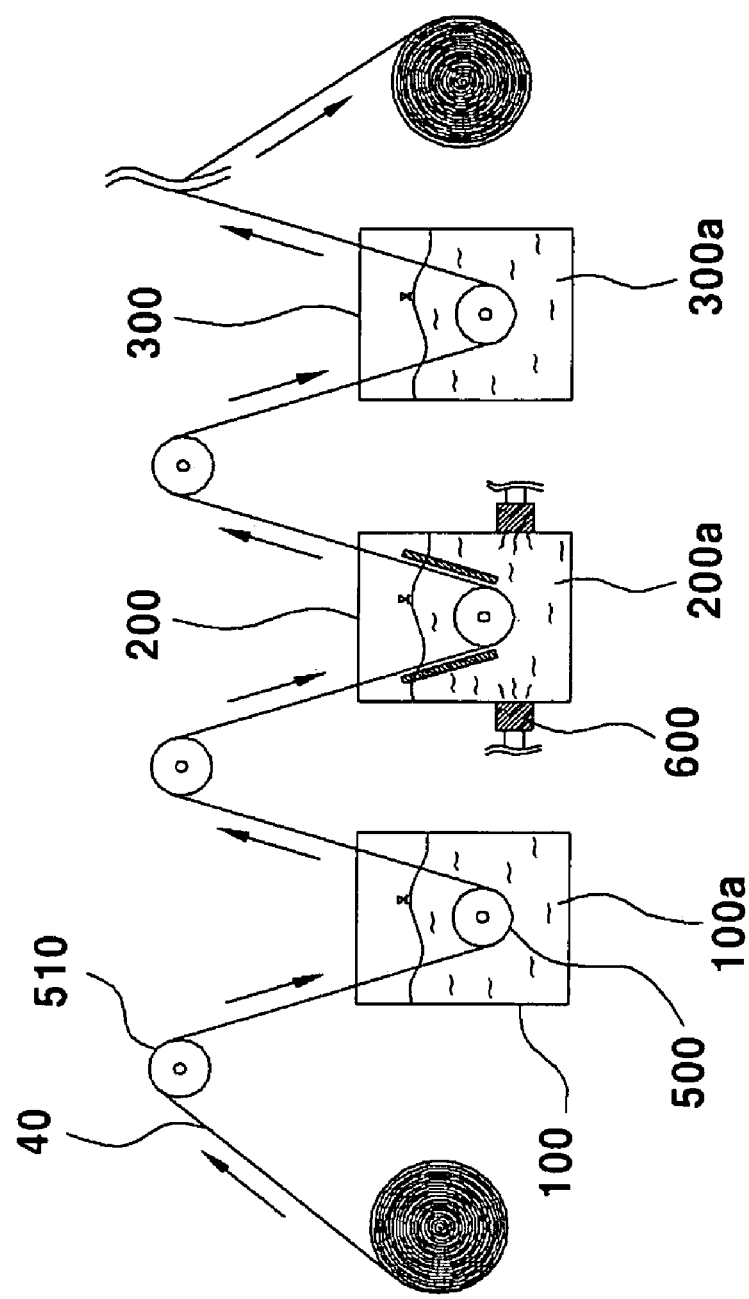
FIG. 4 is a schematic view of a fabricating device for one side of copper foil according to one embodiment of the present invention.
Figure 5:
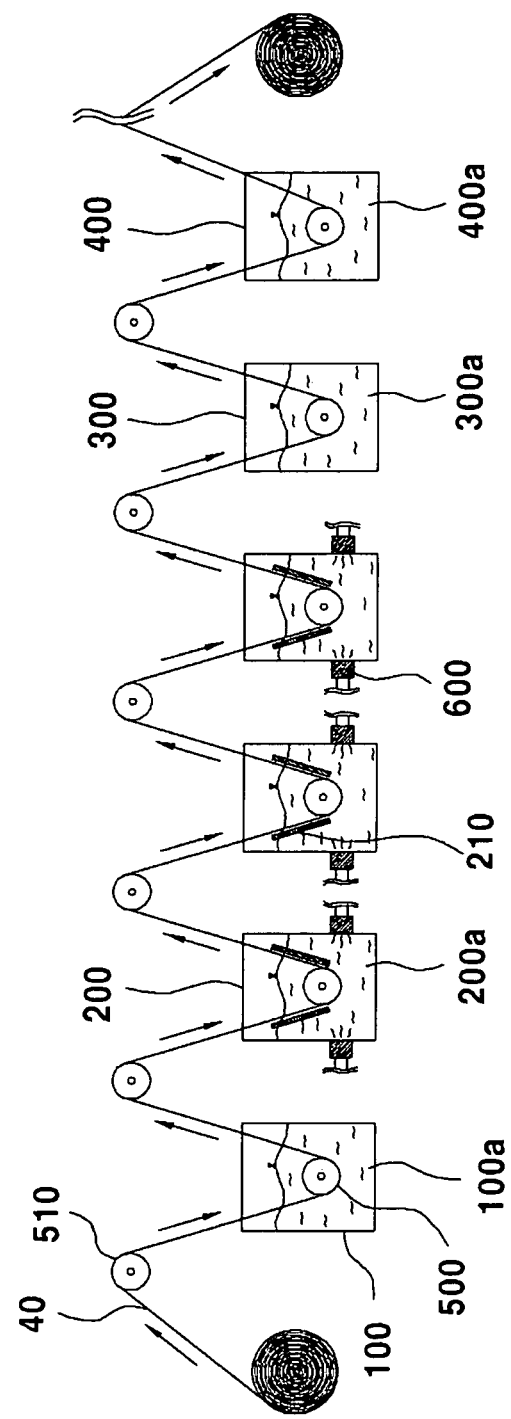
FIG. 5 is a schematic view of a fabricating device for one side of copper foil according to the other embodiment of the present invention.
Figure 6:
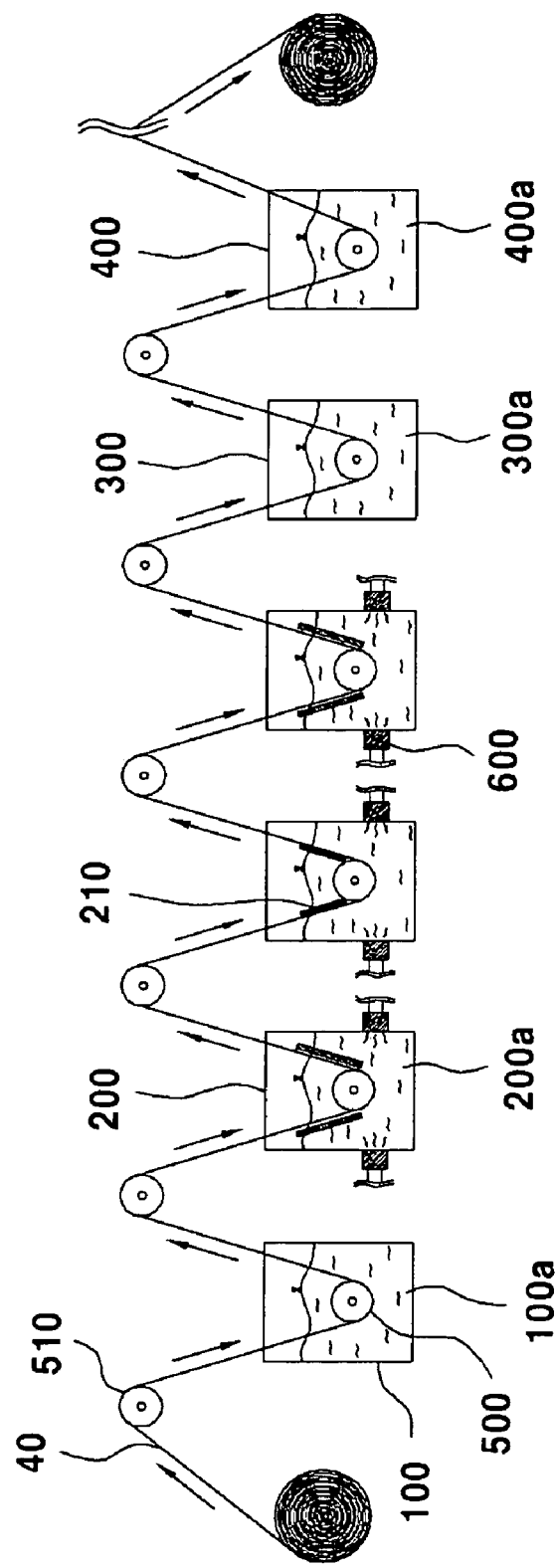
FIG. 6 is a schematic view of a fabricating device for both sides of copper foil according to another embodiment of the present invention.

FIG. 4 is a schematic view of a fabricating device for one side of copper foil according to one embodiment of the present invention, FIG. 5 is a schematic view of a fabricating device for one side of copper foil according to the other embodiment of the present invention, and FIG. 6 is a schematic view of a fabricating device for both sides of copper foil according to another embodiment of the present invention.

As shown in FIGS. 2 to 6, the copper foil manufacturing method of the present invention makes a copper foil 40 having a low roughness and glossy surface by electrolytic polish. Here, the surface can be one side or both sides.

An apparatus for manufacturing a copper foil having a low roughness according to the present invention comprises an acid pickling bath 100 polishing a copper foil 40 using an acid solution 100a; one or at least two electrolytic polishing baths 200 installed adjacent to the acid pickling bath 100 for polishing the copper foil 40 using an electrolytic polishing solution 200a; a water washing bath 300 installed adjacent to the electrolytic polishing bath 200 for washing the copper foil 40 using water; a plurality of dipping rollers 500 installed within each of the baths 100, 200 and 300 for serially guiding the copper foil 40 into/from each bath; a plurality of outside rollers 510 installed at the outside of each of the baths 100, 200 and 300 for guiding the copper foil 40 are geared with the dipping rollers 500; and cathode plates 210 installed to face a matt side of the copper foil having a relatively high surface roughness. Here, the cathode plates 210 are apart from the surface of the rollers with predetermined intervals within the electrolytic polishing bath 200 and also are connected to a cathode electrode of the power supply.

Here, each of the axes of the rollers 500 and 510 is zigzag positioned between the baths and predetermined positions which are upper from the bath. A copper foil before being dipped within the acid pickling bath 100 and a copper foil after passing the water washing bath 300 exist as the status of being wound on the roller. Thus, the copper foil released from the wound roller before processing the electrolytic polishing step S2000 alternately passes the respective outside roller and dipped roller. The copper foil is repeatedly processed the steps of dipping within each of the baths 100, 200 and 300 and coming therefrom. Here, the copper foil 40 is processed the steps of acid pickling, electrolytic polishing and water washing as it is entered into each of the baths and come therefrom.

Preferably, the present invention employees a plurality of electrolytic polishing baths 200 in which electrolytic polishing solution is contained. The electrolytic polishing solution has different conditions such as different acidity, pH, temperature, and density of a corrosion inhibitor in order to precisely control the electrolytic polishing rate.

The apparatus for manufacturing a copper foil having a low roughness according to the present invention further comprises a plating bath 400 installed adjacent to the water washing bath 300 for forming a nodule on the polished copper foil using a plating solution 400a.

Referring to the drawings, the method for manufacturing a copper foil having a low roughness according to the present invention will be explained in detail below.

As shown in FIGS. 2 and 3, the method for manufacturing a copper foil having a low roughness comprises an acid pickling step S1000, an electrolytic polishing step S2000, and a water washing step S3000. Preferably, the method according to the present invention further comprises a nodulating step S4000 and a post-process step S4100 which are performed after the water washing step S3000.

First of all, the copper foil 40 dipped within the acid pickling bath 100 is pickled by the acid solution 100a within the acid pickling bath 100. The acid solution 100a may use sulfuric acid of pH 5.0 or less, hydrochloric acid of pH 5.0 or less, or a mixed solution of sulfuric acid of pH 5.0 or less and hydrochloric acid of pH 5.0 or less. The step of acid pickling is to pickle the copper foil 40 with the acid solution, thereby to remove an oxidized layer thereon.

After pickling with the acid solution, the copper foil 40 is dipped within the electrolytic polishing solution 200a in the electrolytic polishing bath 200 into which the cathode plate 210 is installed. Here, the cathode plate 210 is apart from the surface of the copper foil with a predetermined interval. After that, a positive current is applied to the copper foil 40 and a negative current is applied to the cathode plate 210 such that the surface of the copper foil 40 is electrolytically polished (S2000).

The respective electrolytic polishing bath 200 contains an acid electrolytic polishing solution 200a of pH 5.0 or less. The electrolytic polishing solution 200a preferably may use one or at least two selected from the group consisting of phosphoric acid, sulfuric acid, hydrochloric acid, nitric acid and boric acid.

Here, preferably, the electrolytic polishing solution 200a may comprise a corrosion inhibitor selected one or at least two compounds from the group consisting of chromic acid, urea, mercaptan, and sulfur compounds.

Preferably, the acidity (pH) of the electrolytic polishing solution 200a may be in the range of 2.0 to 3.5. Preferably, the temperature of the electrolytic polishing solution may be in the range of 20 to 90° C. Preferably, the current density applied to the electrolytic polishing solution may be in the range of 10 to 70 A/dm$^2$.

The electrolytic polishing step S2000 is performed within 20 to 120 seconds for each electrolytic polishing bath 200.

The electrolytic polishing occurs between the one side of the copper foil 40 and the cathode plate 210 as a positive current is applied to the copper foil and a negative current is applied to the cathode plate 210. Here, the cathode plate 210 may be implemented as a divided shape in order to uniformly form the current density.

In order to perform the electrolytic polish on the matt side of a relatively high roughness with a relatively high rate, the matt side must face the cathode plate 210 in the electrolytic polishing bath. Then the matt side of the copper foil 40 is polished in the electrolytic polishing step S2000. Accordingly, the matt side of a relatively high roughness can be mainly proceeded in the electrolytic polishing step.

In case of using a plurality of electrolytic polishing baths 200, in order to mainly polish the matt side of a relatively high roughness, the matt side of the copper foil 40 must face the cathode plate 210 in an electrolytic polishing bath 200.

In order that the matt and shiny sides are alternately proceeded in the electrolytic polishing solution 200a in the electrolytic polishing step, the cathode plates 210 in one of the electrolytic polishing bath 200 must face the matt side of the copper foil and the cathode plates 210 in the other of the electrolytic polishing bath 200 must face the shiny side of the copper foil, alternately. Thus, the matt side and the shiny side of the copper foil are alternately proceeded in the electrolytic polishing step. Then, both sides of the copper foil 40 may be glossy with a low roughness. Also, the matt side of a low roughness may have lower roughness additionally or may further shinier. Here, the copper foil with both glossy and low roughness sides may be used for electrode material of a secondary battery.

Since the chemical polishing method polishes the entire surface of the copper foil regardless of their surfaces of the concave and convex portions, it is necessary to decrease a polishing rate of a relatively concave portion in comparison with a convex portion in order to uniformly treat the surfaces of the copper foil.

Because the electrolytic polishing method of the present invention polish the surfaces of the copper foil using a phenomenon that a current is concentrated upon a convex portion or an uneven portion, so the present invention can reduce a roughness of the convex portion lower than the chemical polishing method. To describe more detail, the convex portions have much more chances to contact the electrolytic polishing solution than the concave portion does. Thus, the convex portions are concentrated by the current and an electrolytic polishing rate in the relatively convex portion may be higher than that in the concave portion. Accordingly, the problem of the chemical polishing method is solved.

Preferably, the electrolytic polishing solution 200a forms laminar flows on the surface of the copper foil 40 to accomplish the uniform electrolytic polishing thereon. In order to employ the concept of the laminar flow to the electrolytic polishing solution 200a, a solution supplying nozzle device 600 may be further installed so that it can supply the electrolytic polishing solution 200a to the same direction as the processing direction of the copper foil 40. Here, the solution supplying nozzle device 600 should be installed into the bath with a predetermined distance from the copper foil 40 such that the laminar flow can be formed on the surface of the copper foil. Preferably, a structure within the electrolytic polishing solution bath 200 should be orderly.

It is also preferable that the electrolytic polishing rate is precisely adjusted within a plurality of electrolytic polishing baths 200 so that the copper foil having a low roughness is uniformly manufactured. That is, it is preferable that the electrolytic polishing rate is gradually decreased using a plurality of electrolytic polishing baths 200 containing the different electrolytic polishing solution 200a.

Since the lower the temperature of the electrolytic polishing solution is the slower the electrolytic polishing rate is, the electrolytic polishing rate in the electrolytic polishing step S2000 can be precisely adjusted as the temperature of the electrolytic polishing solution 200a within a plurality of baths 200 is set to be lower according to the direction of the arrangement of the baths, which is the same as the proceeding direction of the copper foil.

Further, since the higher the acidity (pH) of the electrolytic polishing solution 200a is the slower the electrolytic polishing rate is, the electrolytic polishing rate can be precisely adjusted as the acidity (pH) of the electrolytic polishing solution 200a within a plurality of baths 200 is set to be higher according to the direction of the arrangement of the baths, which is the same as the proceeding direction of the copper foil.

In addition, since the higher the density of the corrosion inhibitor such as urea, mercaptan, chromic acid or sulfur compounds is the slower the electrolytic polishing rate is, the electrolytic polishing rate can be precisely adjusted as the density of the corrosion inhibitor added to the electrolytic polishing solution 200a within a plurality of baths 200 is set to higher according to the direction of the arrangement of the baths, which is the same as the proceeding direction of the copper foil.

After finishing the step of the electrolytic polishing, the copper foil 40 is dipped and washed within the water washing bath 300 (S3000).

After processing the water washing step (S3000), the copper foil 40 may further processed by a nodulating process to increase a adhesion with a resin in accordance with its usage in Step of S4000. The nodulating process is to form a nodule on the surface of the copper foil 40. Namely, the nodulating process is to dip the copper foil 40 processed by the water washing into the plating solution 400a within the plating bath 400 adjacent to the water washing bath 300, thereby electroplating the plating solution on the copper foil.

Here, the plating solution 400a may be produced by adding one or at least two elements selected from the group consisting of As, Fe, Mo, and Cr to a mixed solution consisting of Cu, $H_2O$ and $H_2SO_4$.

Preferably, the nodule is formed in order that a peel strength to prepreg becomes 0.8 kg/cm or more through the nodulating process. It is preferable that one element selected from the group consisting of As, Mo, Fe, Cr, etc. is added into the plating solution 400a in order that an average roughness is not increased substantially during the nodulating process. The added elements change a size and distribution shape of spherical electrodeposited copper formed on the convex, thereby the average roughness after the nodulating process being changed up to the range of about 0.5 to 2.0 μm.

The method for manufacturing a copper foil having a low roughness according to the present invention may further comprises the post-process step after the nodulating process step (S4100).

The post-process step S4100 is to electrodeposit one element selected from the group consisting of Zn, Cr, Co, Ni, Mo, W, Sn, and Fe, etc. on the copper foil 40, in accordance with its usage, or to electrodeposit at least two elements of the above elements on the copper foil by alloy electrodepositon. Preferably, a thickness of electrodeposited layer formed on the copper foil in the post-process step S4100 is in the range of about 50 to 100 Å.

The nodulating process step S4000 and the post-process step S4100 should be performed based on surface shape, roughness and the usage of the copper foil 40 considering peel strength, etching characteristics while forming a pattern, high frequency safety, chemical resistance, corrosion resistance, etc.

Meanwhile, if the copper foil 40 is manufactured to have both shiny sides for an electrode material of the secondary battery, it needs only a corrosion resisting process without the nodulating step S4000 or post-treatment step S4100.

The following examples are illustrative of fabricating the copper foil 40 by the method according to the present invention.

EXAMPLE 1

A copper foil 40, which has roughness of 4.5 μm, and thickness of 18 μm, manufactured by electrodeposition and mechanically rolling is processed by the electrolytic polishing method under the following conditions.

Composition of electrolytic polishing solution: phosphoric acid of 67%, sulfuric acid 10%, and water of 23%

Temperature: 50° C.

Current density: 14 A/dm² for initial electrolytic polishing, 8 A/dm² for 1$^{st}$ fine polishing, and 5 A/dm² for 2$^{nd}$ fine polishing.

Polishing time: 60 seconds per one electrolytic polishing bath.

EXAMPLE 2

A copper foil 40, which has roughness of 4.5 μm, and thickness of 18 μm, manufactured by electrodeposition and mechanically rolling is processed by the electrolytic polishing method under the following conditions.

Composition of electrolytic polishing solution: phosphoric acid 57%, sulfuric acid of 20%, and water of 23%

Temperature: 40° C.

Current density: 13 A/dm² for initial electrolytic polishing, 7 A/dm² for 1$^{st}$ fine polishing, and 5 A/dm² for 2$^{nd}$ fine polishing.

Polishing time: 60 seconds per one electrolytic polishing bath.

The following table shows a change of roughness of the copper foil 40 through the electrolytic polishing process according to the examples 1 and 2.

TABLE

| | | Initial electrolytic polishing | 1$^{st}$ fine electrolytic polishing | (unit: μm) 2$^{nd}$ fine electrolytic polishing |
|---|---|---|---|---|
| EXAMPLE 1 | Average roughness | 2.1 | 1.5 | 1.0 |
| EXAMPLE 2 | Average roughness | 2.3 | 1.7 | 1.1 |
| Total average thickness | | 14.7 | 14.0 | 13.4 |

As shown in the table above, the average roughness of the matt side of a copper foil 40 was reduced from an initial roughness of about 4.5 μm to about 2.1 to 2.3 μm at each of the two conditions. Here, the copper foil 40 was not performed by a mechanical polishing after electrodepositing within the copper foil manufacturing device. Then, after the 1$^{st}$ and 2$^{nd}$ fine electrolytic polishing, the average roughness of the matt side was reduced to about 1.0~1.1 μm. At this time, the total average thickness of the copper foil 40 was reduced from about 18 μm before the electrolytic polishing to about 13.4 μm.

Accordingly, the total average thickness of the copper foil was reduced by about 4.5 μm, and the average roughness of the matt side was reduced by about 3.5 μm. The results show that the convex portion of the matt side was electrolytic polished, while the concave portion of the matt side was hardly electrolytic polished.

Figure 7:
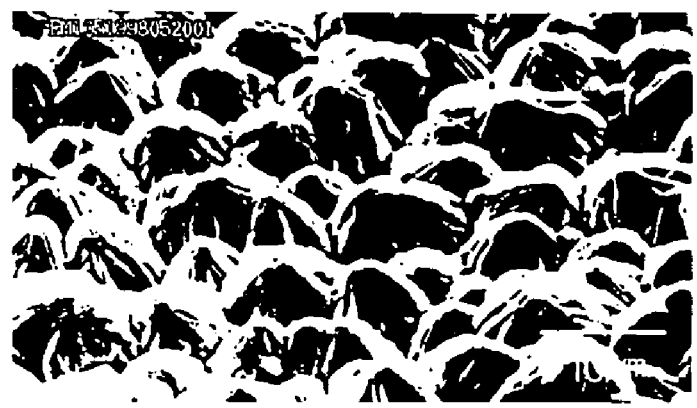
FIG. 7 is a photograph photoed by a SEM(scanning electron microscope) showing a surface of the copper foil before treating the surface according to the present invention.
Figure 8:
FIG. 8 is a photograph photoed by a SEM(scanning electron microscope) showing a surface of the copper foil treated according to the present invention.

FIG. 7 is a photograph photoed by a SEM(scanning electron microscope) showing a surface of copper foil before treating the surface according to the present invention and FIG. 8 is a photograph photoed by a SEM(scanning electron microscope) showing a electrolytic polished surface of copper foil treated according to the present invention.

While, as shown in FIG. 7, the surface of copper foil before treating the surface according to the present invention is uneven, the copper foil treated according to the present invention, as shown in FIG. 8, has a relatively even surface.

Thus, the roughness of the copper foil treated according to the present invention is relatively much lower than that of the copper foil before being treated.

Although the embodiment of the present invention has been described on the basis of the subject matter constituted to render the electrolytic polishing bath 200 to have a series of three baths, it may be implemented to have four or more baths according to the roughness of the copper foil 40.

Further, although the embodiment of the present invention is implemented like the solution supplying nozzle device 600 may be installed into the electrolytic polishing bath 200, it can be installed into the acid pickling bath 100 and the water washing bath 300, as well.

While a preferred embodiment of the invention has been described, it is to be understood that changes and variations may be made without departing the spirit or scope of the invention. Such changes and variations are intended to be within the scope of the invention and the appended claims.

What is claimed is:

1. A method for smoothing a copper foil, comprising:
   applying a positive current to the copper foil,
   applying a negative current to a first cathode plate in a first electrolytic polishing solution and a second cathode plate in a second electrolytic polishing solution,
   dipping the copper foil in the first electrolytic polishing solution, wherein a side of the copper foil faces the first cathode plate,
   removing the copper foil from the first electrolytic polishing solution, and
   dipping the copper foil in the second electrolytic polishing solution, wherein a side of the copper foil faces the second cathode plate;
   wherein
       the first electrolytic polishing solution is of a different temperature, acidity and/or corrosion inhibitor concentration from the second electrolytic polishing solution, and
       the second electrolytic polishing solution has a lower electrolytic polishing rate than the first electrolytic polishing solution.

2. A method for manufacturing a copper foil having very low roughness, the method comprising the steps of;
   pickling a copper foil (40) manufactured by electrodepositon or mechanical rolling within an acid pickling bath (100) containing an acid solution (100a) (S1000);
   electrolytic polishing the copper foil through electrolysis by applying a positive current to the copper foil (40) and by applying a negative current to the cathode plate (210) with dipping the copper foil (40) to face a cathode plate (210) within at least one electrolytic polishing bath (200) installed with the cathode plate and containing an electrolytic polishing solution (200a) (S2000); and
   washing the polished copper foil (40) within a water washing bath (300) containing water (S3000);
   wherein the electrolytic polishing step is performed at a gradually decreasing electrolytic polishing rate using a plurality of electrolytic polishing baths (200) containing the electrolytic polishing solutions (200a) of different electrolytic polishing rates, which electrolytic polishing solutions have different acidity(pH), temperature, and concentration of corrosion inhibitor.

3. The method according to claim 2, wherein the electrolytic polishing solution (200a) is selected one or at least two from the group consisting of phosphoric acid, sulfuric acid, hydrochloric acid, nitric acid and boric acid.

4. The method according to claim 3, wherein the electrolytic polishing solution (200a) further comprises a corrosion inhibitor formed of one or at least two combinations selected from the group consisting of chromic acid, urea, mercaptan, and sulfur compounds.

5. The method according to claim 2, wherein the electrolytic polishing solution (200a) has an acidity within a pH range of 2.0 to 3.5.

6. The method according to claim 2, wherein the electrolytic polishing step is performed in the electrolytic polishing solution having a temperature of 20 to 90° C.

7. The method according to claim 2, wherein the electrolytic polishing step is performed at a current density of 10 to 70 A/dm$^2$.

8. The method according to claim 2, wherein the electrolytic polishing step is performed during 20 to 120 seconds per one electrolytic polishing bath (200).

9. The method according to claim 2, wherein the electrolytic polishing step is performed with the electrolytic polishing solution (200a) having a laminar flow on the surface of the copper foil (40).

10. The method according to claim 2, wherein the electrolytic polishing step is performed by installing the cathode plate (210) to face a matt side of the copper foil having a relatively high roughness.

11. The method according to claim 2, wherein the electrolytic polishing step is performed by arranging alternately the electrolytic polishing bath (200) having the cathode plate (210) installed to face only the matt side of the copper foil and the electrolytic polishing bath (200) having the cathode plate (210) installed to face only the shiny side of the copper foil.

12. The method according to claim 2, wherein the electrolytic polishing step polishes the copper foil precisely as the temperature of the electrolytic polishing solution (200a) within a plurality of baths (200) is set to be lower according to the direction of the arrangement of the baths, which is the same as the proceeding direction of the copper foil.

13. The method according to claim 2, wherein the electrolytic polishing step polishes the copper foil precisely as the acidity (pH) of the electrolytic polishing solution (200a) within a plurality of baths (200) is set to be higher according to the direction of the arrangement of the baths, which is the same as the proceeding direction of the copper foil.

14. The method according to claim 2, wherein the electrolytic polishing step polishes the copper foil precisely as the concentration of the corrosion inhibitor added to the electrolytic polishing solution (200a) within a plurality of baths (200) is set to higher according to the direction of the arrangement of the baths, which is the same as the proceeding direction of the copper foil.

15. The method according to claim 14, wherein the corrosion inhibitor includes one or at lest two chemical compounds selected from the group consisting of chromic acid, urea, mercaptan, and sulfur compounds.

16. The method according to claim 2, wherein the acid solution (100a) includes one selected from the group consisting of sulfuric acid of pH 5.0 or less, hydrochloric acid of pH 5.0 or less, and a mixed solution of sulfuric acid of pH 5.0 or less and hydrochloric acid of pH 5.0 or less.

* * * * *